United States Patent [19]

Crowder et al.

[11] 4,329,706

[45] May 11, 1982

[54] DOPED POLYSILICON SILICIDE SEMICONDUCTOR INTEGRATED CIRCUIT INTERCONNECTIONS

[75] Inventors: Billy L. Crowder, Putnam Valley; Arnold Reisman, Yorktown Heights, both of N.Y.

[73] Assignee: International Business Machines Corporation, Armonk, N.Y.

[21] Appl. No.: 16,647

[22] Filed: Mar. 1, 1979

[51] Int. Cl.³ .................... H01L 29/04; H01L 23/48; H01L 29/46
[52] U.S. Cl. ...................... 357/71; 357/59; 357/67; 357/23
[58] Field of Search ............ 357/67, 68, 71, 59, 357/23

[56] References Cited

U.S. PATENT DOCUMENTS

| | | | |
|---|---|---|---|
| 3,617,824 | 11/1971 | Shinoda et al. | 357/67 |
| 3,653,120 | 4/1972 | Sirrine et al. | 357/59 |
| 3,664,896 | 5/1972 | Duncan | 357/59 |
| 3,667,008 | 5/1972 | Katnack | 357/59 |
| 3,714,520 | 1/1973 | Engeler et al. | 357/59 |
| 3,777,364 | 12/1973 | Schinella et al. | 357/71 |
| 4,042,953 | 8/1977 | Hall | 357/59 |
| 4,102,733 | 7/1978 | Delamoneda et al. | 357/23 |
| 4,106,051 | 8/1978 | Dormer et al. | 357/71 |
| 4,128,670 | 12/1978 | Gaensslen | 357/67 |
| 4,136,434 | 1/1979 | Thibault et al. | 357/59 |
| 4,163,246 | 7/1979 | Homura et al. | 357/59 |
| 4,180,596 | 12/1979 | Crowder et al. | 357/59 |

FOREIGN PATENT DOCUMENTS

2019091 10/1979 United Kingdom .

OTHER PUBLICATIONS

IBM Technical Disclosure Bulletin, by Baglin et al., vol. 20, No. 10, Mar. 1978, p. 4189.
IEEE Transaction on Electron Devices, vol. ED-26, No. 4, Apr. 1979, pp. 369 to 371.
IBM Technical Disclosure Bulletin, vol. 17, No. 6, Nov. 74, "Reducing the Sheet Resistance of Polysilicon Lines in Integrated Circuits", by Rideout, pp. 1831 to 1833.

*Primary Examiner*—Andrew J. James
*Attorney, Agent, or Firm*—Alvin J. Riddles

[57] ABSTRACT

An improved interconnection for semiconductor integrated circuits is provided by a member made of doped polycrystalline silicon and metal silicide that provides the simultaneous advantages of high conductivity and reduced overlap capacitance in multilayer integrated circuit devices. Such interconnecting members are useable to produce field effect transistor type devices.

7 Claims, 9 Drawing Figures

DOPED POLYSILICON SILICIDE SEMICONDUCTOR INTEGRATED CIRCUIT INTERCONNECTIONS

DESCRIPTION

TECHNICAL FIELD

The invention is in the field of semiconductor integrated circuits. At the present state of the art, integrated circuit structures involve a plurality of devices made in a semiconductor crystal with multilevel interconnecting lines running over the top of each other and over the top of isolating regions in the structure. There have been a number of ways in the art such as gaseous diffusion, ion implantation doping and the use of doped polycrystalline semiconductor material to provide the lines. However, the scaling down of device dimensions causes the resistance to increase to levels which seriously impair device performance. This operates to cause the wiring interconnection delay of arrays to assume an intolerably large portion of the circuit delay. In addition, as the resistance becomes larger, voltage drops become larger, making power distribution problems and signal sensing more difficult.

BACKGROUND ART

The advantages of doped polycrystalline silicon in interconnections in semiconductor integrated circuits have been set forth in a wide variety of art of which IBM Technical Disclosure Bulletins, Vol. 20, No. 11A, p. 4286, April 1978; Vol. 20, No. 2, p. 539, July 1977 and Vol. 18, No. 11, p. 3840, April 1976 are examples.

The use of a metal silicide such as molybdenum silicide has been employed in the semiconductor art in discrete devices as set forth in U.S. Pat. No. 3,381,182. In each of these applications, however, the problem of acquiring high conductivity while at the same time controlling capacitance associated with conductor overlap have not been addressed.

DISCLOSURE OF INVENTION

The invention involves a technique of fabricating integrated circuits wherein the interconnections of the integrated circuits are made up of composite conducting lines of doped polycrystalline silicon and metal silicide, the combination hereafter refered to as polycide, which yield the simultaneous advantages of high conductivity and reduced parasitic capacitance.

Figure 1:
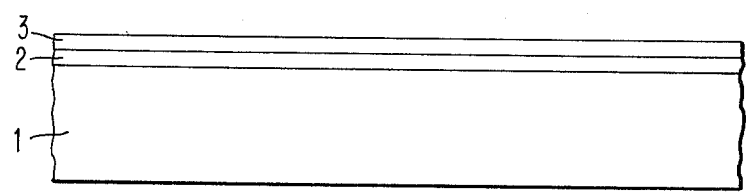
FIG. 1 is an illustration of an improved semiconductor integrated interconnecting conductor.

Referring to FIG. 1, a semiconductor body 1, for example silicon, is provided with a doped polycrystalline silicon line 2. Integrally associated with the doped polycrystalline silicon region 2 is a silicide region 3 wherein a metal is caused to combine with silicon and to form a region of silicide. The region 3 may be formed by conversion to silicide of some of the polycrystalline silicon region 2 or it may be provided from independent sources of silicon and metal. This composite of regions 2 and 3 will be referred to hereinafter as "polycide".

The polycide 2, 3 interconnecting member provides the simultaneous advantages of very high conductivity interconnections accompanied by a reduced parasitic capacitance effect when the interconnecting polycide 2, 3 crosses over other semiconductor device areas separated by insulators. One reason this takes place is that with the polycide interconnecting member 2, 3 there is no longer any need to rely on the conduction of doped regions in the silicon substrate 1. The conductor line is separated from the substrate semiconductor by a layer of oxide. A significant advantage of the polycide member 2, 3 also is that it may be oxidized like polycrystalline silicon allowing other interconnection lines to cross it.

It will be apparent to one skilled in the art that, as the packing density and the number of layers involved in making the semiconductor integrated circuit go up, the particular advantages gained by the polycide member 2, 3 of this invention will become increasingly valuable and provide great device interconnecting flexibility.

BEST MODE FOR CARRYING OUT INVENTION

The improved integrated circuit interconnection technique of the invention may be employed in a wide variety of semiconductor integrated circuit arrays. The illustrations in connection with FIGS. 2 and 3 are directed to the application of interconnecting member 2, 3 to two typical types of semiconductor structures.

Referring next to FIG. 2 and its illustrations 2A, 2B and 2C, the technique of fabrication of an insulated gate field effect transistor involving recessed oxidation isolation is illustrated.

Figure 2A:
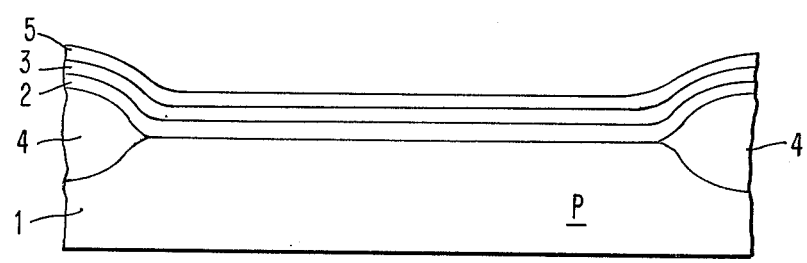
FIGS. 2A, 2B and 2C illustrate the application of the conductor to the fabrication of a field effect transistor device.

In FIG. 2A in a p-conductivity type semiconductor crystal 1, around a region in which the field effect transistor is to be formed, recessed oxide 4 is provided generally by forming around an oxidation mask. The oxide 4 operates to isolate the device to be formed from other devices in the semiconductor crystal. A layer 2 of polycrystalline silicon semiconductor material is placed over the region 4 and over the exposed portion of the crystal 1.

In the formation of the polycrystalline material a dopant of n-conductivity type is included that can be caused later to diffuse into the crystal 1 to form the source 18 and drain 19 regions of an insulated gate Field Effect Transistor (IGFET). A layer 3 of silicide is next formed over the polycrystalline layer 2. The silicide is formed or deposited by the techniques of coevaporation, sputtering, or vacuum deposition such that in the process either the metal combines with the polysilicon to form the silicide or in the alternative the layer 3 is made up in toto of a mixture of codeposited metal and silicon. One satisfactory technique is set forth in copending application Ser. No. 811,914, filed June 30, 1977. The metals that operate best are those that form passivating and insulating oxides with silicon such as tungsten, molybdenum, tantalum, titanium, and rhodium. A layer of silicon dioxide labelled element 5 is formed over the layer 3. The layer 5 may be either formed in situ or partially grown, then partially deposited or completely deposited.

Figure 2B:
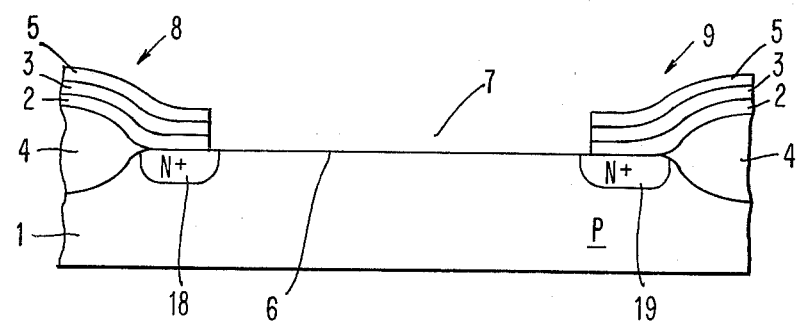

Referring next to FIG. 2B, an etching operation is then undertaken through a mask and an opening 7 is provided in the layers 2, 3 and 5 exposing the region 6 which can serve as the channel of a field effect type device. After the etching, the structure is taken through a heating cycle to form the source 18 and drain 19 regions by out-diffusion from the doped polycrystalline silicon 2. At this point threshold tailoring may be done in region 6. This procedure minimizes redistribution of channel 6 impurities. An alternative procedure is that during the thermal cycle in which the source 18 and 19 regions are out-diffused from the polysilicon 2, a thin gate oxide region as set forth as 10 in FIG. 2C may be grown. Following this threshold adjustment, tailoring may be done using ion implantation techniques.

Figure 2C:
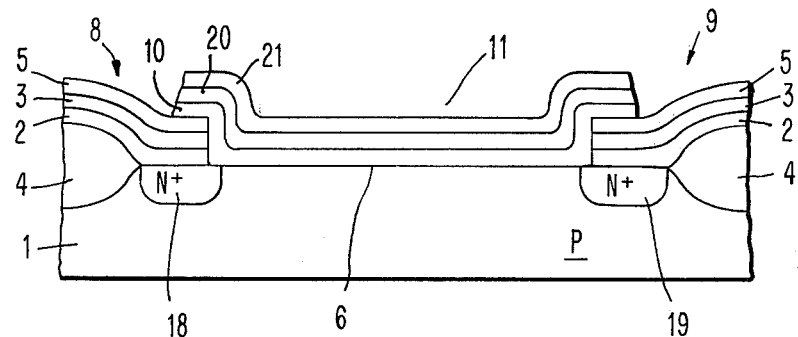

Referring to FIG. 2C the gate of the field effect device is next applied. A first layer of gate oxide 10 is formed in contact with the crystal 1. Next a second polycide layer 20, 21 is applied over element 10 thereby forming the gate structure 11.

A polycide layer 20, 21 is applied so that it overlaps the source 8 and drain 9 electrodes separated by the insulator 10. The dopants and metals employed in the layer 20, 21 may be different from polycide layer 2, 3 to impart different properties, particularly suitable for the gate 11.

It will also be apparent to one skilled in the art that the addition of silicon nitride layers which facilitate self-alignment techniques may be employed in connection with the fabrication of the improved interconnection member of applicant's invention.

While the above description has been directed to a simplified approach to the fabrication of IGFETS, other devices such as bipolar transistors may readily be fabricated using the polycide concepts described herein.

Figure 3A:
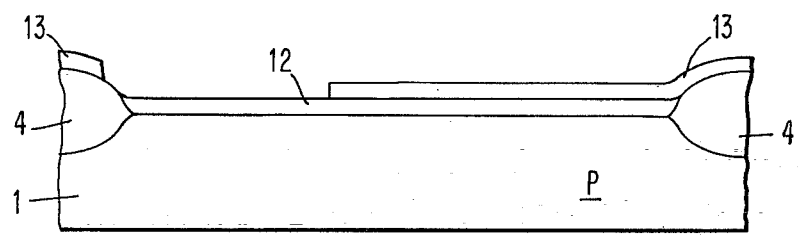
FIGS. 3A, 3B, 3C, 3D and 3E illustrate the application of the invention to the fabrication of a one device semiconductor memory device.
Figure 3B:
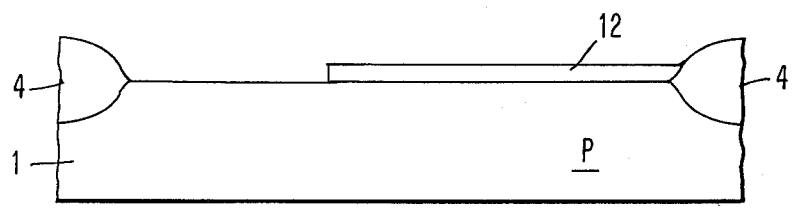
Figure 3C:
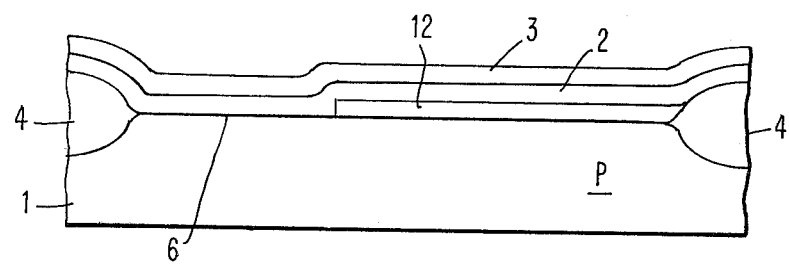
Figure 3D:
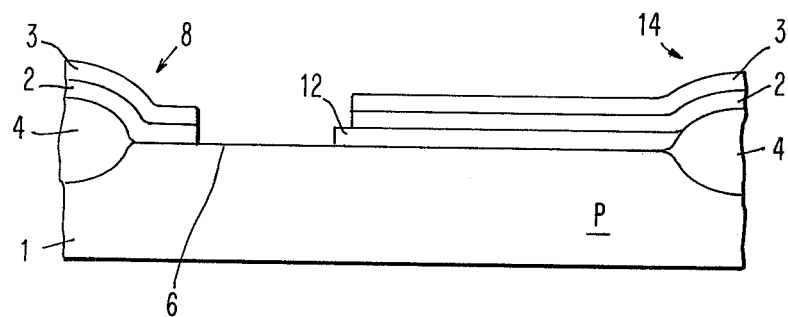
Figure 3E:
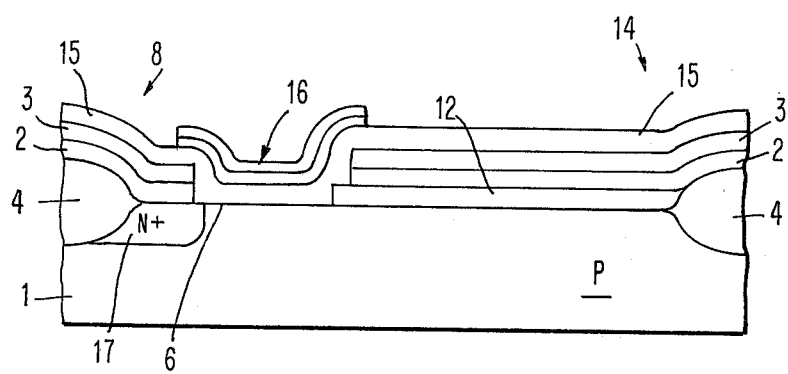

Referring next to FIGS. 3A, through 3E the technique of the invention is shown as applied to the fabrication of a field effect type of device known as a one device memory cell. An example of such a device is shown in U.S. Pat. No. 3,387,286.

Referring to FIG. 3A, in the crystal 1 recessed oxide 4 is provided that defines a device area. The layer of oxide 12 is then grown over the surface of the crystal within the area bounded by 4. A resist 13 is then positioned to cover a portion of the oxide 12 and a portion of the recessed oxide 4 and leaving exposed a portion of the oxide 12.

In FIG. 3B a portion of the oxide 12 is then etched away which exposes a portion of the surface of the crystal 1 and the resist layer 13 is removed.

In FIG. 3C a polycide member 2, 3 is now applied over the remains of the oxide 12 and in contact with the crystal 1.

Referring next to FIG. 3D an etching step re-exposes the crystal and the channel 6. At this point the interconnection 8 is defined. This serves also as the source contact.

Referring next to FIG. 3E a gate structure is formed by growing an oxide layer 15 corresponding to element 10 of FIG. 2C. During this oxidation the polycide structure 2, 3 is also oxidized and the source region 17 is formed by out-diffusion from the doped polycrystalline silicon 2 portion of the polycide member ohmically connected to interconnection contact 8. A second polycide member 16 is then formed completing the gate structure. The resulting structure provides the FET transistor and plate capacitor structure of U.S. Pat. No. 3,387,286.

What has been described is a technique of fabricating improved interconnecting devices employing members composed of a polycrystalline silicon portion associated with a silicide portion both as contacts and as conductor lines which permit simplified FET gate structures to be made therewith.

It should be noted that in the improved field effect type structures of the invention involving both polycide contacts and polycide gates in addition to the improved conductivity and reduced parasitic capacitance structural features, the structures are produced without detrimental processing steps such as heavy ion implantation and diffusion damage.

While the invention has been shown applied to two semiconductor structures, it will be apparent to one skilled in the art in the light of the principles set forth that the application of the teaching will be applicable to many semiconductor structures and to many variations, for example, the substitution of other insulating materials such as silicon nitride for the oxide.

Having described the invention, what is claimed as new and what is desired to secure by Letters Patent is:

1. A semiconductor structure comprising:
   a semiconductor crystal having an exposed device region surrounded by a region of recessed oxide;
   a source type and a drain type particular conductivity type regions in said exposed device region defining a field effect type channel;
   at least one combination of a first high conductivity type member composed of a doped polycrystalline silicon associated with silicide making ohmic contact to each said source and drain region; and
   a second high conductivity type member composed of doped polycrystalline silicon associated with silicide over an oxide layer in said channel and overlapping at least one said first high conductivity type member.

2. In a semiconductor device of the type wherein there are semiconductor regions of a particular conductivity type in a semiconductor device body and other regions separated by insulation from said body, the improvement comprising:
   at least one combination of a first high conductivity type member composed of a doped polycrystalline silicon portion associated with a metal silicide portion serving as a conductor ohmically connected to at least one said particular conductivity type region; and
   a second high conductivity type member composed of a doped polycrystalline silicon portion associated with a metal silicide portion serving as a conductive member over said insulated region on said body, said second high conductivity type member overlapping said first high conductivity type member.

3. In a field effect semiconductor device of the type having at least a source type contact adjacent to a channel in a semiconductor member and a gate member over said channel, the improvement comprising:
   at least one combination of a first high conductivity member composed of a doped polycrystalline silicon portion associated with a metal silicide portion employed as a conductor ohmically connected to said source type region; and
   a second high conductivity member composed of a doped polycrystalline silicon portion associated with a metal silicide portion employed as a gate member over an oxide over said channel, at least a portion thereof overlapping said first high conductivity type member.

4. A semiconductor structure comprising:

a semiconductor crystal having a first conductivity type device region thereof surrounded by a region of recessed oxide;

a first layer of oxide over a portion of said device region leaving an exposed region of said semiconductor crystal within said device region;

a first contacting member composed of a portion of doped polycrystalline silicon associated with a portion of metal silicide in contact with said oxide;

a second contacting member composed of a portion of doped polycrystalline silicon associated with a portion of metal silicide in contact with an opposite conductivity type region in a portion of said exposed portion of said device region adjacent to said recessed oxide; and a gate type contact composed of a layer of an oxide in contact with the remainder of said exposed portion of said device region and overlapping both said first and said second contacting members and contiguous layers of doped polysilicon and silicide.

5. A field effect transistor structure comprising in combination:

a silicon semiconductor body member of a first conductivity type;

an active device area delineating oxide region surrounding an area of the surface of said body wherein opposite portions of said area are separated by a dimension corresponding approximately to the channel of a field effect transistor;

a source and a drain region of opposite conductivity type to said body member in said body member each adjacent to one of said opposite portions of said device area;

at least source and drain doped interconnecting members of a portion of doped polysilicon associated with a portion of silicide making ohmic contact with said source and said drain regions and passing over said device area delineating oxide region; and a gate member comprised of an oxide layer in contact with said semiconductor body between said source and drain region and extending over said interconnecting members and a further gate layer of doped polysilicon associated with silicide over and coextensive with said gate oxide layer and overlapping said interconnecting members.

6. The field effect transistor of claim 5 wherein said interconnecting members are covered by a passivating layer.

7. A one device memory structure comprising in combination:

a silicon semiconductor body member of a first conductivity type;

an active device area delineating oxide region surrounding an area of the surface of said body;

a storage member oxide in contact with a portion of the surface of said body and extending a portion of a distance dimension from one portion of said device area delineating oxide to an opposite portion;

a device contact of opposite conductivity type in a portion of said device area adjacent to said delineating oxide along said distance dimension opposite to the portion of said device delineating oxide from which said storage member oxide is positioned;

a first interconnecting member of doped polysilicon associated with silicide in ohmic contact with said device contact and at least extending over the adjacent device area delineating oxide region;

a second interconnecting member of doped polysilicon associated with silicide positioned over said storage oxide terminating in said device area before said oxide and extending at least over the adjacent device area delineating oxide region; and a gate member comprised of an oxide layer in contact with the remaining portion of the surface of said device area between said storage member oxide and said device contact and extending over said interconnecting members and said gate member further having a layer of doped polysilicon associated with silicide extending over said gate oxide and overlapping both said interconnecting members.

* * * * *